United States Patent
Luan

(10) Patent No.: US 8,269,289 B2
(45) Date of Patent: *Sep. 18, 2012

(54) TRANSISTOR DEVICE AND METHODS OF MANUFACTURE THEREOF

(75) Inventor: Hongfa Luan, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/204,137

(22) Filed: Aug. 5, 2011

(65) Prior Publication Data

US 2011/0284970 A1  Nov. 24, 2011

Related U.S. Application Data

(62) Division of application No. 11/635,207, filed on Dec. 7, 2006, now Pat. No. 8,017,484, which is a division of application No. 11/085,334, filed on Mar. 21, 2005, now Pat. No. 7,160,781.

(51) Int. Cl.
H01L 21/02 (2006.01)
(52) U.S. Cl. ......... 257/411; 438/287; 438/763; 438/765
(58) Field of Classification Search .......... 438/287, 438/763, 785, 240; 257/410, 411, E21.639
See application file for complete search history.

(56) References Cited

U.S. PATENT DOCUMENTS

| | | | |
|---|---|---|---|
| 4,432,035 A | 2/1984 | Hsieh et al. |
| 4,990,974 A | 2/1991 | Vinal |
| 5,041,885 A | 8/1991 | Gualandris et al. |
| 5,066,995 A | 11/1991 | Young et al. |
| 5,162,263 A | 11/1992 | Kunishima et al. |
| 5,321,287 A | 6/1994 | Uemura et al. |
| 5,352,631 A | 10/1994 | Sitaram et al. |
| 5,763,922 A | 6/1998 | Chau |
| 5,880,508 A | 3/1999 | Wu |
| 5,994,747 A | 11/1999 | Wu |
| 6,020,243 A | 2/2000 | Wallace et al. |
| 6,027,961 A | 2/2000 | Maiti et al. |
| 6,048,769 A | 4/2000 | Chau |
| 6,084,280 A | 7/2000 | Gardner et al. |
| 6,124,171 A | 9/2000 | Arghavani et al. |
| 6,159,782 A | 12/2000 | Xiang et al. |

(Continued)

FOREIGN PATENT DOCUMENTS

EP  1 388 889  2/2004

(Continued)

OTHER PUBLICATIONS

Hobbs, C., et al., "Fermi Level Pinning at the PolySi/Metal Oxide Interface," 2003 Symp. VLSI Tech. Digest of Tech. Papers, Jun. 2003, 2 pg.

(Continued)

Primary Examiner — Jarrett Stark
Assistant Examiner — John M Parker
(74) Attorney, Agent, or Firm — Slater & Matsil, L.L.P.

(57) ABSTRACT

Methods of forming transistor devices and structures thereof are disclosed. A first dielectric material is formed over a workpiece, and a second dielectric material is formed over the first dielectric material. The workpiece is annealed, causing a portion of the second dielectric material to combine with the first dielectric material and form a third dielectric material. The second dielectric material is removed, and a gate material is formed over the third dielectric material. The gate material and the third dielectric material are patterned to form at least one transistor.

21 Claims, 3 Drawing Sheets

U.S. PATENT DOCUMENTS

| | | |
|---|---|---|
| 6,171,910 B1 | 1/2001 | Hobbs et al. |
| 6,184,072 B1 | 2/2001 | Kaushik et al. |
| 6,225,163 B1 | 5/2001 | Bergemont |
| 6,291,867 B1 | 9/2001 | Wallace et al. |
| 6,348,390 B1 | 2/2002 | Wu |
| 6,373,111 B1 | 4/2002 | Zheng et al. |
| 6,410,967 B1 | 6/2002 | Hause et al. |
| 6,444,555 B2 | 9/2002 | Ibok |
| 6,448,127 B1 | 9/2002 | Xiang et al. |
| 6,475,908 B1 | 11/2002 | Lin et al. |
| 6,492,217 B1 | 12/2002 | Bai et al. |
| 6,528,858 B1 | 3/2003 | Yu et al. |
| 6,563,183 B1 | 5/2003 | En et al. |
| 6,656,764 B1 | 12/2003 | Wang et al. |
| 6,693,333 B1 | 2/2004 | Yu |
| 6,706,581 B1 | 3/2004 | Hou et al. |
| 6,716,685 B2 | 4/2004 | Lahaug |
| 6,720,221 B1 | 4/2004 | Ahn et al. |
| 6,737,313 B1 | 5/2004 | Marsh et al. |
| 6,740,944 B1 | 5/2004 | McElheny et al. |
| 6,852,645 B2 | 2/2005 | Colombo et al. |
| 6,890,807 B2 | 5/2005 | Chau et al. |
| 6,897,095 B1 | 5/2005 | Adetutu et al. |
| 6,921,691 B1 | 7/2005 | Li et al. |
| 7,060,568 B2 | 6/2006 | Metz et al. |
| 7,091,568 B2 | 8/2006 | Hegde et al. |
| 7,348,284 B2 | 3/2008 | Doyle et al. |
| 7,361,958 B2 | 4/2008 | Brask et al. |
| 2001/0012653 A1 | 8/2001 | Tsukamoto |
| 2002/0005556 A1 | 1/2002 | Cartier et al. |
| 2002/0053711 A1 | 5/2002 | Chau et al. |
| 2002/0090773 A1 | 7/2002 | Bojarczuk, Jr. et al. |
| 2002/0135030 A1 | 9/2002 | Horikawa |
| 2002/0135048 A1 | 9/2002 | Ahn et al. |
| 2002/0151125 A1 | 10/2002 | Kim et al. |
| 2002/0153573 A1 | 10/2002 | Mogami |
| 2003/0057432 A1 | 3/2003 | Gardner et al. |
| 2003/0104663 A1 | 6/2003 | Visokay et al. |
| 2003/0116804 A1 | 6/2003 | Visokay et al. |
| 2003/0137017 A1 | 7/2003 | Hisamoto et al. |
| 2003/0141560 A1 | 7/2003 | Sun |
| 2004/0000695 A1 | 1/2004 | Matsuo |
| 2004/0005749 A1 | 1/2004 | Choi et al. |
| 2004/0009675 A1 | 1/2004 | Eissa et al. |
| 2004/0023462 A1 | 2/2004 | Rotondaro et al. |
| 2004/0132271 A1 | 7/2004 | Ang et al. |
| 2004/0180487 A1 | 9/2004 | Eppich et al. |
| 2004/0217429 A1 | 11/2004 | Lin et al. |
| 2004/0242021 A1 | 12/2004 | Kraus et al. |
| 2005/0098839 A1 | 5/2005 | Lee et al. |
| 2005/0101159 A1 | 5/2005 | Droopad |
| 2005/0139926 A1 | 6/2005 | Shimizu et al. |
| 2005/0224897 A1 | 10/2005 | Chen et al. |
| 2005/0245019 A1 | 11/2005 | Luo et al. |
| 2006/0003507 A1 | 1/2006 | Jung et al. |
| 2006/0017112 A1 | 1/2006 | Wang et al. |
| 2006/0038236 A1 | 2/2006 | Yamamoto |
| 2006/0118879 A1 | 6/2006 | Li |
| 2006/0125018 A1 | 6/2006 | Lee et al. |
| 2006/0131652 A1 | 6/2006 | Li |
| 2006/0141729 A1 | 6/2006 | Wang |
| 2006/0223335 A1 | 10/2006 | Matthew et al. |
| 2006/0275975 A1 | 12/2006 | Yeh et al. |
| 2006/0292773 A1 | 12/2006 | Goolsby et al. |
| 2007/0018245 A1 | 1/2007 | Jeng |
| 2007/0020903 A1 | 1/2007 | Takehara et al. |
| 2007/0034945 A1 | 2/2007 | Bohr et al. |

FOREIGN PATENT DOCUMENTS

| | | |
|---|---|---|
| EP | 1 531 496 | 5/2005 |
| JP | 2002-118175 | 4/2002 |
| JP | 2004-289061 | 10/2004 |
| WO | WO 01/66832 | 9/2001 |
| WO | WO 2004/095556 | 11/2004 |
| WO | WO 2005/114718 | 12/2005 |

OTHER PUBLICATIONS

"Front End Processes," The International Technology Roadmap for Semiconductors: 2002 Update, pp. 45-62.

Guha, S., et al., "Atomic Beam Deposition of Lanthanum—and Yttrium-Based Oxide Thin Films for Gate Dielectrics," Applied Physics Letters, Oct. 23, 2000, pp. 2710-2712, vol. 77, No. 17, Amer. Institute of Physics.

"High k Dielectric Materials," Tutorial: Materials for Thin Films/ Microelectronics, downloaded Jun. 9, 2004, 3 pages, Sigma-Aldrich Co., St. Louis, Missouri, US, http://www.sigmaaldrich.com/Area_ of_Interest/Organic_Inorganic_Chemistry/Materials_Science/ Thin_Films_Microelectronics/Tutoiral/Dielectric_Materials.html.

Muller, R. S., et al. "Device Electronics for Integrated Circuits," Second Ed., 1986, pp. 380-385, 398-399, John Wiley & Sons, New York, NY.

Samavedam, S. B., et al. "Fermi Level Pinning with Sub-Monolayer MeOx and Metal Gates," Mar. 2003, 4 pages, IEEE.

Wolf, S., "Silicon Processing for the VLSI Era: vol. II—CMOS Process Integration," 1990, pp. 432-441, Lattice Press, Sunset Beach, CA.

"Front End Processes," The International Technology Roadmap for Semiconductors: 2003 Edition, pp. 23-25.

Gannavaram, S. et al. "Low Temperature (≤800 C) Recessed Junction Selective Silicon-Germanium Source/Drain Technology for sub-70 nm CMOS," 2000, 4 pages, IEEE.

Huang, F.-J., et al. "Schottky-Clamped NMOS Transistors Implemented in a Conventional 0.8 μm CMOS Process," IEEE Electron Device Letters, Sep. 1998, pp. 326-328, vol. 19, No. 9, IEEE.

Park, D.-G., et al., "Thermally Robust Dual-Work Function ALD-MN$_x$ MOSFETs using Conventional CMOS Process Flow," 2004 Symp. on VLSI Tech. Digest of Tech. Papers, 2004, pp. 186-187, IEEE.

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977, IEEE.

LIN, R., et al., "An Adjustable Work Function Technology Using Mo Gate for CMOS Devices," IEEE Electronic Device Letters, vol. 23, No. 1, Jan. 2002, pp. 49-51, IEEE.

Wakabayashi, H, et al. "A Dual-Metal Gate CMOS Technology Using Nitrogen-Concentration-Controlled TiNx Film," IEEE Transactions on Electron Devices, vol. 48, No. 10, Oct. 2001, pp. 2363-2369, IEEE.

Wolf, S., et al., "Silicon Processing for the VLSI Era," 2000, 4 pages, vol. 1—Process Technology, Second Edition, Lattice Press, Sunset Beach, Ca.

TRANSISTOR DEVICE AND METHODS OF MANUFACTURE THEREOF

This is a divisional application of U.S. patent application Ser. No. 11/635,207, entitled "Transistor Device and Methods of Manufacture Thereof" which was filed on Dec. 7, 2006 which is a divisional of U.S. patent application Ser. No. 11/085,334, which was filed on Mar. 21, 2005 and issue on Jan. 9, 2007 as U.S. Pat. No. 7,160,781, both of which are hereby incorporated herein by reference.

TECHNICAL FIELD

The present invention relates generally to semiconductor devices, and more particularly to transistors and methods of manufacturing thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complimentary MOS (CMOS) devices, use both positive and negative channel devices, e.g., a positive channel metal oxide semiconductor (PMOS) transistor and a negative channel metal oxide semiconductor (NMOS) transistor, in complimentary configurations. An NMOS device negatively charges so that the transistor is turned on or off by the movement of electrons, whereas a PMOS device involves the movement of electron vacancies. While the manufacture of CMOS devices requires more manufacturing steps and more transistors, CMOS devices are advantageous because they utilize less power, and the devices may be made smaller and faster.

The gate dielectric for MOSFET devices has in the past typically comprised silicon dioxide, which has a dielectric constant of about 3.9. However, as devices are scaled down in size, using silicon dioxide for a gate dielectric becomes a problem because of gate leakage current, which can degrade device performance. For low power logic (for portable electronic applications, for example), it is important to use devices having low leakage current, in order to extend battery life. Gate leakage current must be controlled in low power applications, as well as sub-threshold leakage, junction leakage, and band-to-band tunneling. Therefore, there is a trend in the industry towards the development of the use of high dielectric constant (k) materials for use as the gate dielectric in MOSFET devices, which lowers the gate leakage current. The term "high k dielectric materials" as used herein refers to a dielectric material having a dielectric constant of about 4.0 or greater.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric. The work function of a semiconductor or conductor directly affects the threshold voltage of a transistor when the material is used as a gate electrode. In CMOS devices, it is important that the threshold voltage $V_t$ for the NMOS and PMOS transistors be symmetric, to optimize CMOS device performance.

A problem with using high-k gate dielectric materials such as a hafnium-based dielectric material is that such high-k dielectric materials exhibit a Fermi-pinning effect, which is caused by the interaction of the high-k gate dielectric material with the adjacent gate material. When used as a gate dielectric in a transistor, high k gate dielectric material pins or fixes the work function. The Fermi-pinning effect of high k gate dielectric materials causes a threshold voltage shift and low mobility, due to the increased charge caused by the Fermi-pinning effect. Thus, a symmetric $V_t$ for the NMOS and PMOS transistors of a CMOS device having a high k dielectric material for the gate dielectric is difficult to achieve. Efforts have been made to improve the quality of high-k dielectric films and resolve the Fermi-pinning problems, but the efforts have resulted in little success.

Thus, what are needed in the art are CMOS transistor devices and methods of manufacturing thereof that have a high-k gate dielectric material and a symmetric $V_t$ for the p channel metal oxide semiconductor (PMOS) and n channel metal oxide semiconductor (NMOS) transistors of the CMOS devices.

SUMMARY OF THE INVENTION

These and other problems are generally solved or circumvented, and technical advantages are generally achieved, by preferred embodiments of the present invention, which provide novel methods of manufacturing transistor devices, wherein a high k dielectric material is deposited over a silicon dioxide or silicon oxynitride layer, and the device is annealed. A portion of the high k dielectric material combines with the silicon dioxide or silicon oxynitride during the anneal process. The high k dielectric material is removed, and the silicon dioxide or silicon oxynitride layer combined with the portion of the high k dielectric material is used as a gate dielectric of a transistor.

In accordance with a preferred embodiment of the present invention, a method of manufacturing a semiconductor device includes providing a workpiece, forming a first dielectric material over the workpiece, forming a second dielectric material over the first dielectric material, and annealing the workpiece, causing a portion of the second dielectric material to combine with the first dielectric material and form a third dielectric material. The second dielectric material is removed, and a gate material is formed over the third dielectric material. The gate material and the third dielectric material are patterned to form at least one transistor.

In accordance with another preferred embodiment of the present invention, a method of manufacturing a CMOS device includes providing a workpiece, the workpiece comprising a first region and a second region, forming a first dielectric material over the workpiece, and forming a second dielectric material over the first dielectric material. The workpiece is annealed, causing a portion of the second dielectric material to combine with the first dielectric material and form a third dielectric material. The second dielectric material is removed, and a first gate material is formed over the third dielectric material in the first region. A second gate material is formed over the third dielectric material in the second region.

The first gate material, the second gate material, and the third dielectric material are patterned to form a first transistor in the first region of the workpiece and a second transistor in the second region of the workpiece. Forming either the first transistor or the second transistor comprises forming a PMOS device or an NMOS device.

In accordance with yet another preferred embodiment of the present invention, a transistor includes workpiece, a gate dielectric disposed over the workpiece, and a gate disposed over the gate dielectric. The gate dielectric has a top portion and a bottom portion, and comprises a mixture of silicon dioxide or silicon oxynitride and an element or combination of elements. The gate dielectric comprises a greater amount of the element or combination of elements in the top portion of the gate dielectric than in the bottom portion of the gate dielectric.

Advantages of preferred embodiments of the present invention include providing methods of fabricating CMOS devices and structures thereof, wherein the PMOS transistor and NMOS transistors have a dielectric constant greater than the dielectric constant of silicon dioxide, and wherein the PMOS and NMOS transistors have a substantially symmetric $V_t$.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
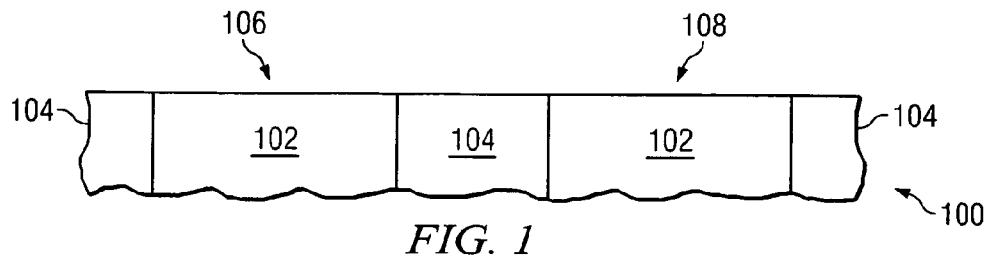
FIGS. 1 through 9 show cross-sectional views of a semiconductor device at various stages of manufacturing in accordance with a preferred embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

When used as a gate dielectric of a transistor, high-k gate dielectric materials generally yield orders of magnitude lower gate leakage current than $SiO_2$ gate dielectric materials with the same effective oxide thickness (EOT). For low standby power (LSTP) and high performance (HP) applications, a high-k gate dielectric is a potential solution in the roadmap for the advanced technology nodes. High k gate dielectric materials are expected to achieve the EOT, gate leakage ($J_g$), mobility, and hysteresis parameters required by LSTP applications. However, $V_t$ controllability with high k gate dielectric materials is proving challenging. In particular, in order to make high k gate dielectric materials useful in CMOS applications, the CMOS device requires a symmetrical $V_{tn}$ and $V_{tp}$ (e.g., $V_{tn}$=0.3 V and $V_{tp}$=−0.3 V).

However, attempts to use a high-k dielectric material such as $HfO_2$ as a gate dielectric material have been problematic. In particular, attempts have been made to use $HfO_2$, which is a high-k dielectric material having a dielectric constant of about 25, as the gate dielectric for both the PMOS and NMOS FETs of a CMOS device. The work function of a polysilicon gate using a $HfO_2$ gate dielectric has been found to be pinned, as a result of Fermi-pinning, at a point close to the conduction band of polysilicon, causing the polysilicon gate to function as N type polysilicon, even for the polysilicon gate doped with P type dopant, for the PMOS device. Therefore, the threshold voltage $V_{tp}$ of the PMOS device was found to be much higher than expected; e.g., $V_{tp}$ was −1.2 V while $V_{tn}$ was 0.4 V, which is very asymmetric.

The Fermi-pinning effect is believed to be related to the Hf—Si bond at the gate electrode to gate dielectric interface, which is almost impossible to avoid. Therefore, the Fermi-pinning effect makes the use of polysilicon as a gate electrode incompatible with Hf-based high-k gate dielectric materials in CMOS devices. Fully silicided polysilicon (FUSI) gates and metal gates have also exhibited Fermi-pinning effects and are undesirable for use as gate electrode materials when a high-k dielectric such as hafnium is used for a gate dielectric.

Embodiments of the present invention solve the Fermi-pinning problem that occurs when high k dielectric material are used as a gate dielectric in transistors. A layer of $SiO_2$ or SiON is deposited over the substrate, and a high k dielectric material layer is deposited over the $SiO_2$ or SiON. The substrate is annealed, causing a portion of the high k dielectric material to migrate and/or diffuse into the $SiO_2$ or SiON layer, forming a gate dielectric mixture layer comprised of the $SiO_2$ or SiON and the high k dielectric material over the substrate. The high k dielectric material layer is then removed. A gate is then formed over the gate dielectric mixture layer, and the manufacturing process of the transistor is then continued. The gate material of the PMOS and NMOS transistors is preferably selected to set the work function of the PMOS and NMOS transistors. The gate dielectric mixture layer solves the Fermi-pinning problem and results in a CMOS device with a symmetric threshold voltage $V_t$ for the PMOS and NMOS transistor.

The present invention will be described with respect to preferred embodiments in a specific context, namely a CMOS transistor. Embodiments of the present invention may also be applied, however, to other semiconductor device applications where two or more transistors are utilized. Embodiments of the present invention may also be implemented in single transistor applications, for example. Note that in the drawings shown, only one PMOS device and one NMOS device are shown; however, there may be many PMOS and NMOS devices formed on a semiconductor workpiece during each of the manufacturing processes described herein.

FIGS. 1 through 9 show cross-sectional views of a semiconductor device 100 at various stages of manufacturing in accordance with a preferred embodiment of the present invention. With reference first to FIG. 1, there is shown a semiconductor device 100 in a cross-sectional view including a workpiece 102. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

The workpiece 102 includes a first region 106 and a second region 108. The first region 106 may comprise a region where a first transistor comprising a PMOS device or PMOSFET, as examples, will be formed. The second region 108 may comprise a region where a second transistor comprising an NMOS device or NMOSFET will be formed, as examples. The PMOS device and NMOS device are not shown in FIG. 1: see FIG. 9. Alternatively, the first region 106 may comprise a region where an NMOS device or NMOSFET will be formed, and the second region 108 may comprise a region where a PMOS or PMOSFET will be formed, as examples.

The first region 106 and the second region 108 may be separated by an optional shallow trench isolation (STI) region 104 formed in the workpiece 102, as shown. The first region 106 may be doped with n type dopants, e.g., to form an N well, and the second region 108 may be doped with p type dopants, e.g., to form a P well, e.g., if a PMOS device and an NMOS device will be formed in the first region 106 and second region 108, respectively. In general, the workpiece 102 is doped with n or p type dopants depending on whether the junctions of the transistor to be formed will be p or n type, respectively.

The workpiece 102 may be cleaned using a pre-gate clean process to remove contaminants or native oxide from the top surface of the workpiece 102. The pre-gate treatment may comprise a HF, HCl or ozone based cleaning treatment, as examples, although the pre-gate treatment may alternatively comprise other chemistries.

Figure 2:
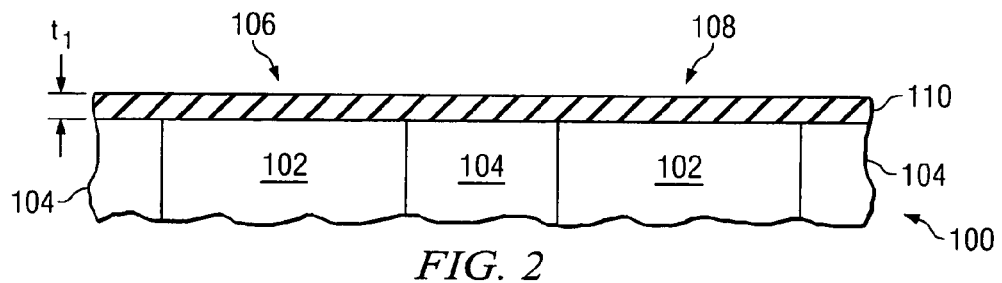

A first dielectric material 110 is formed over the workpiece 102, as shown in FIG. 2. The first dielectric material 110 preferably comprises silicon dioxide ($SiO_2$) or silicon oxynitride (SiON), and preferably comprises a thickness $t_1$ of about 50 Angstroms or less, in one embodiment. More preferably, the first dielectric material 110 comprises a thickness $t_1$ of about 10 to 30 Angstroms, in another embodiment, for example. Alternatively, the first dielectric material 110 may comprise other dimensions. The first dielectric material 110 may be deposited by chemical vapor deposition (CVD), atomic layer deposition (ALD), or other deposition techniques, as examples. In one embodiment, the first dielectric material 110 is preferably thermally grown, e.g., by placing the workpiece 102 into a furnace and heating it in an oxygen environment. The dielectric constant of the first dielectric material 110 is preferably about 3.9, for example.

Figure 3:
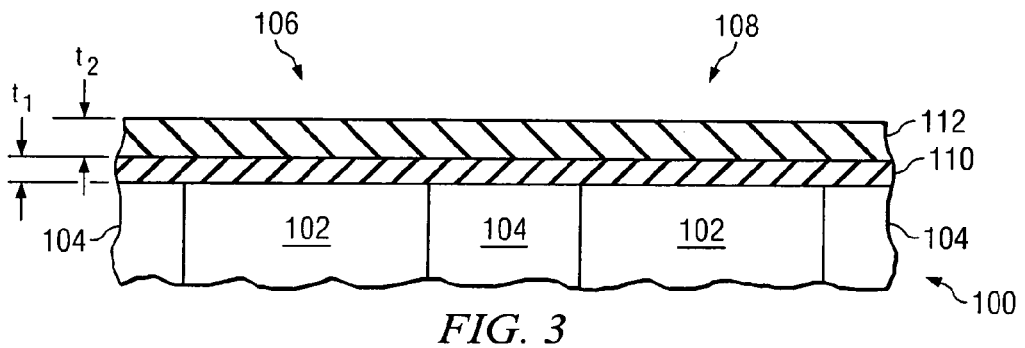

A second dielectric material 112 is formed over the first dielectric material 110, as shown in FIG. 3. The second dielectric material 112 preferably comprises a different material than the first dielectric material 110. The second dielectric material 112 preferably comprises a high k dielectric material in accordance with embodiments of the present invention. For example, the second dielectric material 112 preferably comprises an insulating material having a dielectric constant of about 4.0 or greater. The second dielectric material 112 preferably comprises a thickness $t_2$ of about 50 Angstroms or less, in one embodiment. More preferably, the second dielectric material 112 comprises a thickness $t_2$ of about 20 to 30 Angstroms, in another embodiment, for example. Alternatively, the second dielectric material 112 may comprise other dimensions. The second dielectric material 112 preferably comprises $HfO_2$, $Al_2O_3$, $ZrO_2$, $Ta_2O_5$, $La_2O_3$, $HfAlO_x$, $ZrAlO_x$, $HfSiO_x$, $ZrSiO_x$, nitrides thereof, $Si_xN_y$, $SiO_xN_y$, or combinations thereof, as examples, although alternatively, the second dielectric material 112 may comprise other materials. The second dielectric material 112 may be formed by CVD, ALD, metal organic chemical vapor deposition (MOCVD), physical vapor deposition (PVD), or jet vapor deposition (JVD), as examples, although alternatively, the second dielectric material 112 may be formed using other techniques.

Figure 4:
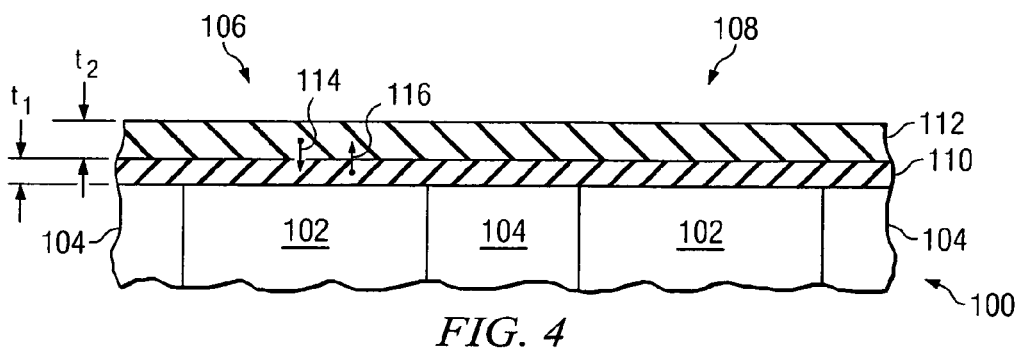
Figure 5:
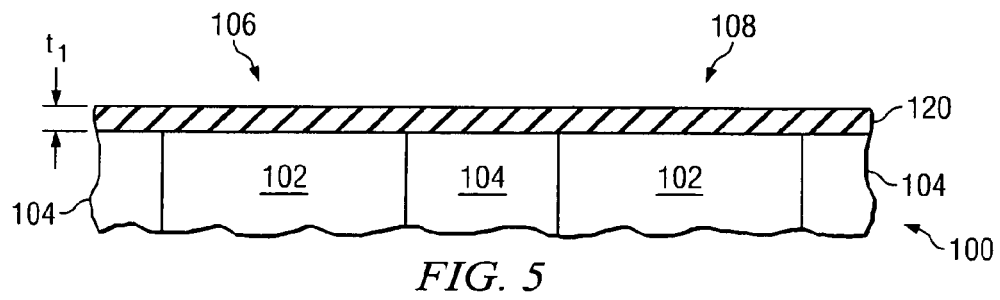

Next, the workpiece 102 is annealed, causing a portion of the second dielectric material 112 to combine with the first dielectric material 110 and form a third dielectric material 120, as shown in FIGS. 4 and 5. The anneal process preferably comprises heating the workpiece 102 for about 60 seconds or less at a temperature of about 700 to 1,000 degrees C., for example, although alternatively, other temperatures and time periods may be used.

The anneal process causes a portion of the second dielectric material 112 to diffuse out of the second dielectric material 112 and migrate towards the first dielectric material 110, combining with the first dielectric material 110 to form the third dielectric material 120 shown in FIG. 5. For example, the second dielectric material 112 may comprise a high k dielectric material comprising an oxide of an element or combination of elements 114 (see FIG. 4), and annealing the workpiece causes the element or combination of elements 114 in the high k material 112 to move downwards into the first dielectric material 110 to form the third dielectric material 120 comprising a mixture of silicon dioxide or silicon oxynitride and the element or combination of elements 114. The third dielectric material 120 preferably comprises $HfSiO_x$, $AlSiO_x$, $ZrSiO_x$, $Ta_2SiO_5$, $La_2SiO_3$, $HfSiAlO_x$, $ZrSiAlO_x$, nitrides thereof, $SiO_xN_y$, or combinations thereof, in accordance with embodiments of the present invention. For example, if the second dielectric material 112 comprises $HfO_2$, then Hf moves into the first dielectric material 110, which preferably comprises $SiO_2$ or SiON, forming $HfSiO_x$.

Annealing the workpiece 102 may also cause oxygen 116 from the first dielectric material 110 to move upwards into the second dielectric material 112, for example. The thickness $t_1$ of the third dielectric material 120 is substantially the same as the thickness $t_1$ of the first dielectric material 110 after the anneal process, for example.

Because the anneal process causes a portion of the second dielectric material 112 to diffuse into the first dielectric material 110, the element or combination of elements 114 that moves into the first dielectric material 110 to form the third dielectric material 120 may have a Gaussian profile. More particularly, the third dielectric material 120 may comprise a top portion and a bottom portion, wherein the third dielectric material 120 comprises a greater amount of the element or combination of elements 114 in the top portion than in the bottom portion. For example, the third dielectric material 120 may comprise a greater amount of the high k dielectric material of the second dielectric material 112 in the top portion than in the bottom portion of the third dielectric material 120.

The second dielectric material 112 is then removed, as shown in FIG. 5, leaving the third dielectric material 120 disposed over the workpiece 102. The second dielectric material 112 may be removed using a wet or dry etch process, or a sputter process, as examples.

Figure 6:
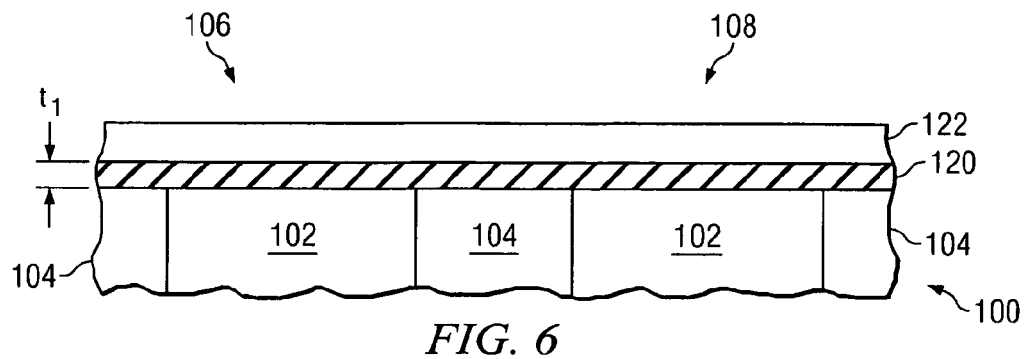

A gate material 122 is then deposited over the third dielectric material 120, as shown in FIG. 6. The gate material 122 preferably comprises a thickness of about 2,000 Å or less, for example. In one embodiment, the gate material of the PMOS device formed in the first region 106 is preferably different than the gate material of the NMOS device formed in the second region 108, for example. The gate materials of the PMOS and NMOS device may be selected to tune the work function of the PMOS and NMOS transistors, resulting in a CMOS device having a substantially symmetric threshold voltage $V_t$, in accordance with embodiments of the present invention, for example. The gate material of the transistors described herein preferably comprises a semiconductive material, a conductive material, or one or more layers of both, for example.

Figure 7:
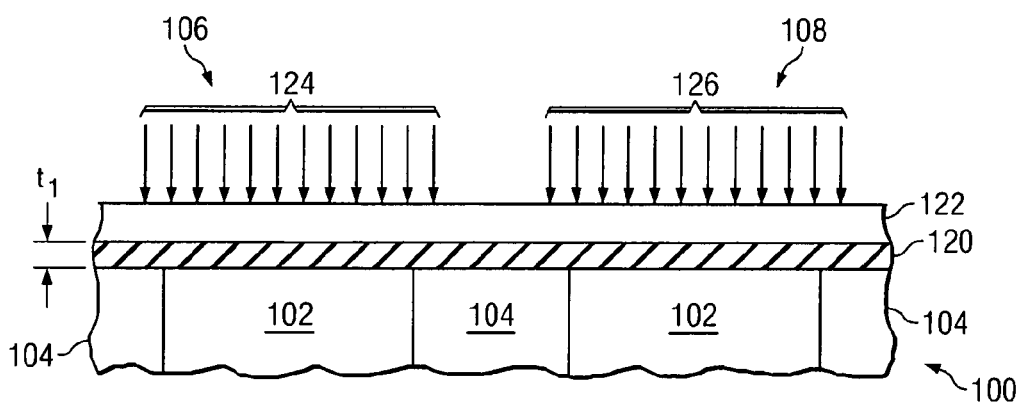

In the embodiment shown in FIGS. 1 through 9, the gate material 122 preferably comprises a semiconductive material, such as polysilicon, although alternatively, the gate material 122 may comprise other semiconductive materials, such as amorphous silicon or other semiconductors, as examples. Preferably, the gate material 122 is implanted in the first region with a first dopant 124, as shown in FIG. 7, and the gate material 122 is implanted in the second region with a second dopant 126, wherein the second dopant 126 is different than the first dopant 124. For example, if the first region 106 comprises a PMOS transistor, the first dopant 124 preferably comprises a P type dopant, and if the second region 108 comprises an NMOS transistor, the second dopant 126 preferably comprises an N type dopant. The first region 106 and the second region 108 may be masked, e.g., using a photoresist and/or hard mask, not shown, while the second region 108 and the first region 106, respectively, are implanted with dopants 126 and 124, respectively, for example, not shown in the figures.

Figure 8:
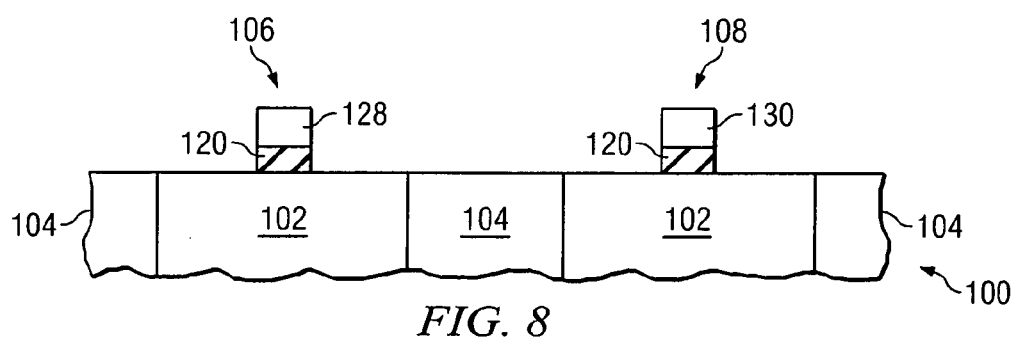
Figure 9:
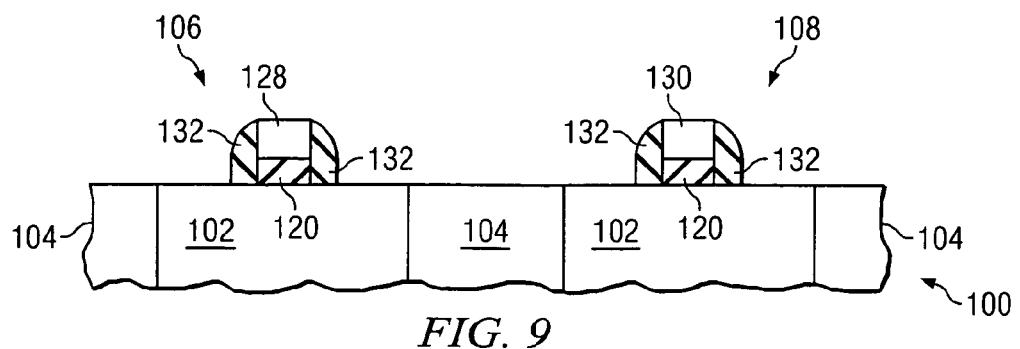

The gate material 122 and the third dielectric material 120 are then patterned using lithography to form at least one transistor, as shown in FIG. 8. Processing of the semiconductor device 100 is then continued, such as forming sidewalls spacers 132 over the sidewalls of the gates 128 and 130 and third dielectric material 120, as shown in FIG. 9. The workpiece 102 may be implanted with dopants to form source and drain regions (not shown) in the workpiece 102 proximate the gates 120, for example. Electrical connection is then made to the gates, source and drain regions, dielectric layers may be formed over the transistors, additional metallization and insulating layers may be formed and patterned over the top surface of the insulating material and electrical connections, and a passivation layer may be formed (not shown), as examples. Bond pads (also not shown) may be formed, and the semiconductor devices may then be singulated or separated into individual die. The bond pads may be connected to leads of an integrated circuit package (also not shown) or other die, for example, in order to provide electrical contact to the transistors formed in the first and second regions 106 and 108 of the semiconductor device 100, for example.

In the embodiment shown, the semiconductor device 100 shown comprises a PMOS transistor in the first region 106 comprising a gate 128 comprised of a semiconductive material implanted with a first dopant (e.g., dopant 124 shown in FIG. 7), and an NMOS transistor in the second region 108 comprising a gate 130 comprised of a semiconductive material implanted with a second dopant (e.g., dopant 126 shown in FIG. 7). Advantageously, the gate dielectric 120 of both transistors comprises a dielectric material having a dielectric constant greater than the dielectric constant of silicon dioxide, because the elements or combinations of elements mixed in with the silicon dioxide increase the dielectric constant of the gate dielectric 120. Fermi-pinning is not a problem in the structure 100, and the work function of the transistors may be set using the gate 128 and 130 material selection.

Figure 10:
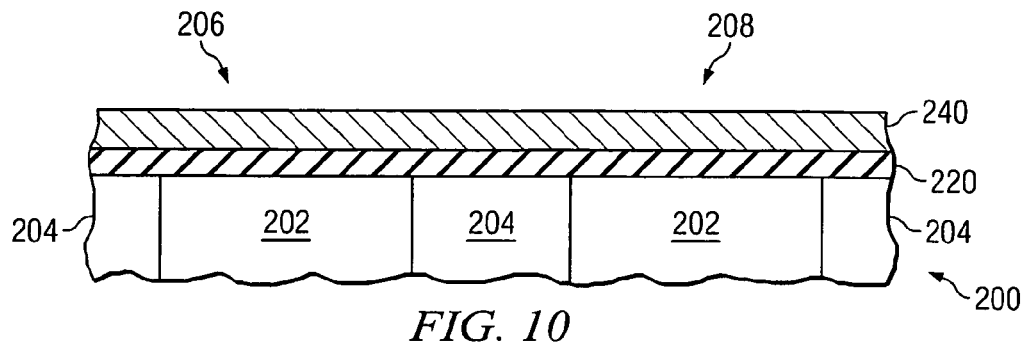
FIGS. 10 through 12 show cross-sectional views of a semiconductor device at various stages of manufacturing in accordance with another embodiment of the present invention.
Figure 11:
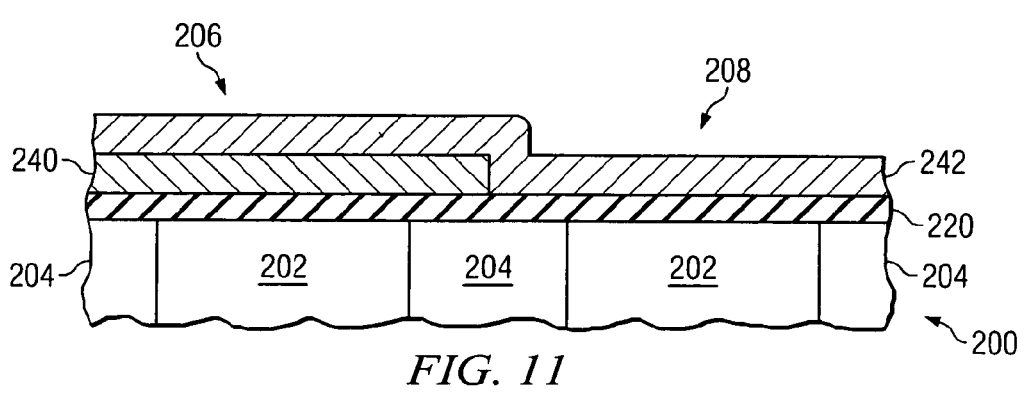
Figure 12:
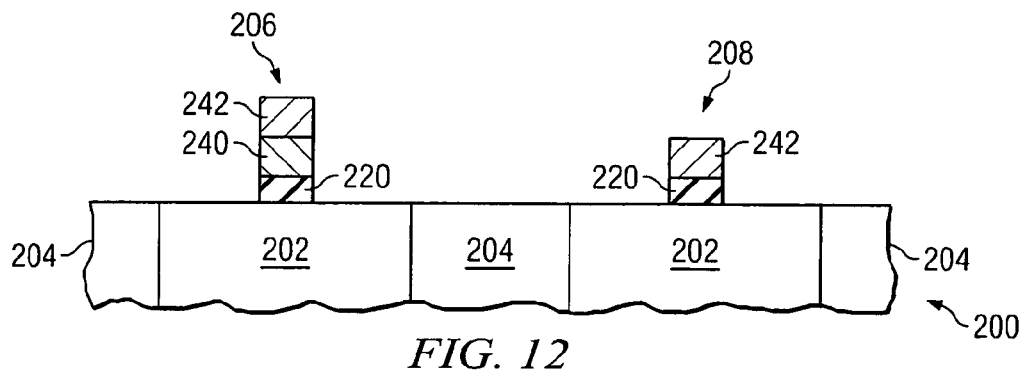

In another embodiment, shown in a cross-sectional view in FIGS. 10 through 12, the gates of the transistors preferably comprise a metal Like numerals are used for the elements depicted in FIGS. 10 through 12 as were used in FIGS. 1 through 9.

For example, a first conductive material 240/242 may be formed over the gate dielectric 220 in the first region 206, and a second conductive material 242 may be formed over the gate dielectric 220 in the second region 208 of the workpiece 202. A method of manufacturing the semiconductor device 200 may comprise forming a first conductive material 240 over the third dielectric material 220 in both the first region 206 and the second region 208, as shown in FIG. 10. The first conductive material 240 preferably comprises a thickness of about 100 Å up to a few hundred Å, and the second conductive material 242 preferably comprises a thickness of about 1,000 Å or less, as examples, although alternatively, the first conductive material 240 and the second conductive material 242 may comprise other dimensions.

The first conductive material 240 may be removed using lithography techniques from over the second region 208, e.g., by depositing a photoresist (not shown), patterning the photoresist, using the photoresist as a mask while portions of the first conductive material 240 are etched away, and then stripping the photoresist. A second conductive material 242 may then be deposited over the first conductive material 240 in the first region 206 and over the third dielectric material 220 in the second region 208, as shown in FIG. 11. The second conductive material 242, first conductive material 240, and third dielectric material 220 are then patterned to form transistors, as shown in FIG. 12. Processing of the transistors is then continued, such as forming sidewall spacers, as shown in and described with reference to FIG. 9.

In the embodiment shown in FIGS. 10 through 12, the first conductive material 240 and the second conductive material 242 may comprise Ta, Ti, Ru, Mo, Re, Pt, Co, Rh, conductive oxides and nitrides thereof, or combinations thereof, as examples, although alternatively, the first conductive material 240 and the second conductive material 242 may comprise other materials, for example.

Figure 13:
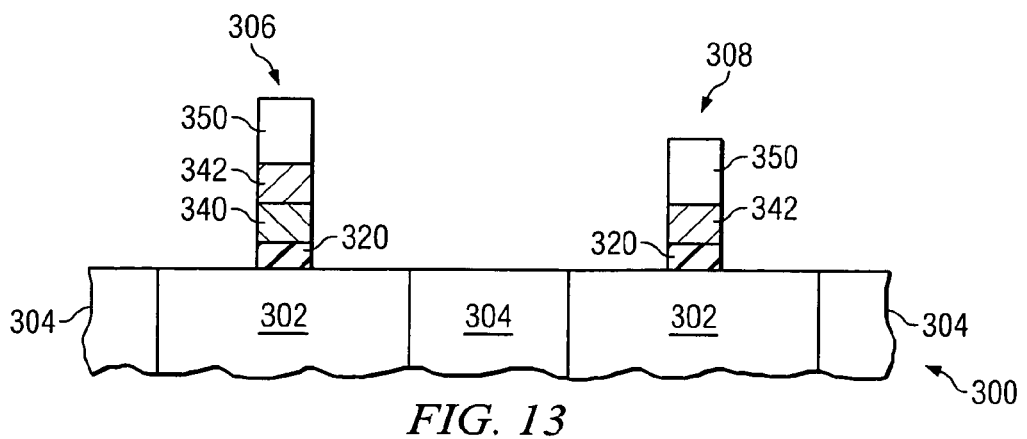
FIG. 13 shows a cross-sectional view of another embodiment of the present invention.

In another embodiment, shown in a cross-sectional view in FIG. 13, a semiconductive material 350 such as polysilicon may be formed over the second conductive material 342, before patterning the second conductive material 342, first conductive material 340, and third dielectric material 320. Again, like numerals are used for the elements depicted in FIG. 13 as were used in FIGS. 1 through 9 and FIGS. 10 through 12. The layer of polysilicon 350 may comprise a thickness of about 2,000 Å or less, for example, although alternatively, the semiconductive material layer 350 may comprise other semiconductive material and other dimensions, for example.

Note that in the embodiment shown in FIG. 13, the first conductive material 340 and the second conductive material 342 may be thinner than the embodiment shown in FIGS. 10 through 12. For example, the first conductive material 340 and the second conductive material 342 may comprise a thickness of about 100 Å, and the semiconductive material layer 350 disposed over the second conductive material 342 may comprise a thickness of about 1,000 Å.

Embodiments of the present invention include methods of forming one or more transistors, and structures thereof. For example, in one embodiment, referring again to FIG. 9, a transistor includes a workpiece 102, and a gate dielectric 120 disposed over the workpiece 102, the gate dielectric 120 having a top portion and a bottom portion and comprising a mixture of silicon dioxide and an element or combination of elements (e.g., the element or combinations of elements 114 from the second dielectric material 112 shown in FIG. 4). The transistor includes a gate (e.g., gate 128 or 130 shown in FIG. 9) disposed over the gate dielectric 120, wherein the gate dielectric 120 comprises a greater amount of the element or combination of elements in the top portion of the gate dielectric than in the bottom portion of the gate dielectric.

Advantages of preferred embodiments of the present invention include providing methods of fabricating transistor and CMOS devices 100, 200, and 300 and structures thereof, wherein the PMOS transistor and NMOS transistor have a substantially symmetric $V_t$. For example, $V_{tn}$ may be about +0.2 to +5 V, and $V_{tp}$ may be the substantially the same negative value, e.g., about −0.2 to −5 V. The threshold voltages $V_t$ may alternatively comprise other voltage levels, for example. The material selection of the gates 128, 130, 240/242, 242, 340/342/350, and 342/350 can be tuned to set the work function of the CMOS devices 100, 200, and 300. Advantageously, the high k dielectric material (e.g., second dielectric material 112 shown in FIG. 4) is removed from the structure, so that there is no interface between a high k dielectric material and the gate; thus, the transistors are not deleteriously effected by Fermi-pinning, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor, comprising:
a single layer of gate dielectric having a top portion and a bottom portion, the single layer of gate dielectric comprising a mixture of silicon dioxide or silicon oxynitride and a combination of two elements selected from the group consisting of Zr, Al, La, Ta and Hf, wherein the single layer of gate dielectric comprises a greater amount of the combination of elements in the top portion of the single layer of gate dielectric than in the bottom portion of the single layer of gate dielectric, the single layer of gate dielectric disposed directly over a substrate; and
a gate disposed directly over the single layer of gate dielectric.

2. The transistor according to claim 1, wherein the combination of elements are selected such that the single layer of gate dielectric formed of the combination of elements has a dielectric constant of about 4.0 or greater.

3. The transistor according to claim 1, wherein the single layer of gate dielectric comprises a material selected from the group consisting of $HfSiO_x$, $AlSiO_x$, $ZrSiO_x$, $Ta_2SiO_5$, $La_2SiO_3$, $HfSiAlO_x$, $ZrSiAlO_x$, and nitrides thereof.

4. The transistor according to claim 1, wherein the gate comprises a semiconductive material.

5. The transistor according to claim 4, wherein the gate comprises polysilicon.

6. The transistor according to claim 1, wherein the gate has a thickness of about 2,000 Å or less.

7. The transistor according to claim 1, wherein the gate comprises Ta, Ti, Ru, Mo, Re, Pt, Co, Rh, conductive oxides and nitrides thereof, or combinations thereof.

8. The transistor according to claim 1, wherein the gate is a metal gate.

9. A device, comprising:
a first transistor comprising
a gate dielectric disposed directly over a substrate, the gate dielectric having a top portion and a bottom portion, the gate dielectric comprising in one layer a mixture of silicon dioxide or silicon oxynitride and an element selected from the group consisting of Hf, Al, Zr, Ta, La, and combinations thereof, wherein the gate dielectric comprises a greater amount of the element or the combinations of elements in the top portion of the gate dielectric than in the bottom portion of the gate dielectric; and
a first gate disposed directly over the gate dielectric; and
a second transistor comprising
the gate dielectric disposed directly over the substrate;
a second gate disposed directly over the gate dielectric.

10. The device according to claim 9, wherein the combination of elements are selected such that the dielectric formed of the combination of elements has a dielectric constant of about 4.0 or greater.

11. The device according to claim 9, wherein the gate dielectric comprises a material selected from the group consisting of HfSiOX, AlSiOx, ZrSiOx, Ta2SiO5, La2SiO3, HfSiAlOx, ZrSiAlOx, and nitrides thereof.

12. The device according to claim 9, wherein the first gate and the second gate comprise a semiconductive material.

13. The device according to claim 9, wherein the first gate and the second gate comprise polysilicon.

14. The device according to claim 9, wherein the first gate and the second gate have a thickness of about 2,000 Å or less.

15. The device according to claim 9, wherein the first gate and the second gate comprise Ta, Ti, Ru, Mo, Re, Pt, Co, Rh, conductive oxides and nitrides thereof, or combinations thereof.

16. The device according to claim 9, wherein the first gate and the second gate are a metal gate.

17. The device according to claim 9, wherein the first gate comprises a first gate material and a second gate material, and wherein the second gate comprises the first gate material but not the second gate material.

18. A device comprising:
a first transistor comprising:
a first gate dielectric disposed directly over a substrate, the first gate dielectric having a first top portion and a first bottom portion, the first gate dielectric comprising in one layer a first mixture of silicon dioxide or silicon oxynitride and an first element selected from the group consisting of Hf, Al, Zr, Ta, La, and combinations thereof, wherein the first gate dielectric comprises a first greater amount of a first combination of the first elements in the first top portion of the first gate dielectric than in the first bottom portion of the first gate dielectric;

a first lower gate disposed over the first gate dielectric; and a first upper gate disposed over the first lower gate; and a second transistor comprising:

a second gate dielectric disposed directly over the substrate, the second gate dielectric having a top second portion and a second bottom portion, the second gate dielectric comprising in one layer a second mixture of silicon dioxide or silicon oxynitride and a second element selected from the group consisting of Hf, Al, Zr, Ta, La, and combinations thereof, wherein the second gate dielectric comprises a second greater amount of a second combination of the elements in the second top portion of the second gate dielectric than in the second bottom portion of the second gate dielectric; and a second upper gate disposed directly over the second gate dielectric.

19. The device according to claim 18, wherein the first gate dielectric and the second gate dielectric comprise a material selected from the group consisting of $HfSiO_x$, $AlSiO_x$, $ZrSiO_x$, $Ta_2SiO_5$, $La_2SiO_3$, $HfSiAlO_x$, $ZrSiAlO_x$, and nitrides thereof.

20. The device according to claim 18, wherein the first lower gate comprises a different conductive material than the first upper gate.

21. The device according to claim 18, wherein the first upper gate and the second upper gate comprise Ta, Ti, Ru, Mo, Re, Pt, Co, Rh, conductive oxides and nitrides thereof, or combinations thereof.

* * * * *